(12) United States Patent
Huang

(10) Patent No.: US 6,559,525 B2
(45) Date of Patent: *May 6, 2003

(54) SEMICONDUCTOR PACKAGE HAVING HEAT SINK AT THE OUTER SURFACE

(75) Inventor: Chien-Ping Huang, Hsinchu Hsien (TW)

(73) Assignee: Siliconware Precision Industries Co., Ltd., Taichung Hsien (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 12 days.

This patent is subject to a terminal disclaimer.

(21) Appl. No.: 09/482,425

(22) Filed: Jan. 13, 2000

(65) Prior Publication Data

US 2001/0045644 A1 Nov. 29, 2001

(51) Int. Cl.[7] .................. H01L 23/495; H01L 23/02; H01L 23/48; H01L 23/52
(52) U.S. Cl. .................. 257/675; 257/676; 257/666; 257/777; 257/723; 257/713; 257/686; 257/687; 257/690; 257/684
(58) Field of Search ................ 257/675, 707, 257/777, 796, 706, 676, 686, 713, 786, 723

(56) References Cited

U.S. PATENT DOCUMENTS

| 5,157,480 | A | * | 10/1992 | McShane et al. | ............ 357/74 |
|---|---|---|---|---|---|
| 5,345,106 | A | * | 9/1994 | Doering et al. | ............. 257/675 |
| 5,757,080 | A | * | 5/1998 | Sota | ............... 257/777 |
| 5,793,108 | A | * | 8/1998 | Nakanishi et al. | .......... 257/723 |
| 5,869,883 | A | * | 2/1999 | Mehringer et al. | ......... 257/667 |
| 5,929,513 | A | * | 7/1999 | Asano et al. | ............... 257/675 |
| 6,002,181 | A | * | 12/1999 | Yamada et al. | ............. 257/787 |
| 6,081,027 | A | * | 6/2000 | Akram | ....................... 257/707 |
| 6,198,171 | B1 | * | 3/2001 | Huang et al. | ............... 257/787 |
| 6,211,462 | B1 | * | 4/2001 | Carter, Jr. et al. | .......... 174/52.4 |
| 6,265,771 | B1 | * | 7/2001 | Ference et al. | ............. 257/706 |
| 6,414,385 | B1 | * | 7/2002 | Huang et al. | ............... 257/690 |

* cited by examiner

Primary Examiner—Tom Thomas
Assistant Examiner—Nitin Pareich
(74) Attorney, Agent, or Firm—J.C. Patents

(57) ABSTRACT

A semiconductor package having heat sink at the outer surface is constructed on a lead frame. The package comprises a chip, a die pad, a plurality of leads, a plurality of bonding wires, and a molding compound. The die pad has a first surface and a second surface, and the chip has its active surface bonded to the first surface of the die pad. The area of the die pad is smaller than the area of the chip in order to expose the bonding pads on the active surface of the chip. The leads having an inner lead portions and an outer lead portions are disposed at the periphery of the die pad, and the inner lead portions are electrically connected to the bonding pads by a plurality of bonding wires. The molding compound encapsulates the chip, the die pad, the inner lead portions of the leads, and the bonding wires. The second surface of the die pad is exposed on the top surface of the package structure while the outer lead portion of the leads is exposed at the side edge of the package structure.

7 Claims, 4 Drawing Sheets

SEMICONDUCTOR PACKAGE HAVING HEAT SINK AT THE OUTER SURFACE

BACKGROUND OF THE INVENTION

1. Field of the Invention

This invention relates to a semiconductor package having heat sink at the outer surface, and more particularly to a semiconductor package having heat sink at the outer surface that can enhance the heat-dissipating effect.

2. Description of Related Art

Following the evolution of the integrated circuit technology, the manufacturing process of integrated circuit has been advanced to ever high in integration with a target of pursuing ever dense on the design of the package structure for the packaging process in the back end process. Owing to the demand of high speed on the data processing, the signal frequency of semiconductor devices is getting higher and higher. Together with the increase in the integration of semiconductor and the package density, the heat generation per unit time per unit volume has increased significantly. Therefore, just how to provide the semiconductor package with even more effective heat-dissipating path has become an important issue in order to improve the performance of the semiconductor devices.

FIG. 1 is a schematic cross-sectional view of a semiconductor package according to a prior art. As shown in FIG. 1, the package structure shown in FIG. 1 has been disclosed in the U.S. Pat. No. 5,252,783 (Motorola, 1993), and U.S. Pat. No. 5,594,234 (TI, 1997). The semiconductor package disclosed in these two patents is constructed on a lead frame and is having a die pad 102 surrounded by a plurality of leads 108. The die pad 102 has a top surface 104 and a bottom surface 106. The lead 108 has an inner lead portion 110 and an outer lead portion 112. The chip 114 has its back surface 118 bonded to the die pad 102 by the use of an adhesive 122. The bonding pads 120 on the active surface 116 of the chip 114 are electrically connected to the inner lead portion 110 of the leads 108 by the use of bonding wires 124. A molding compound 126 encapsulate the chip 114, the die pad 102, and the inner lead portion 110 of the leads 108 so as to constitute a package structure 100 that has a top surface 130 and a bottom surface 132. In order to facilitate the subsequent SMT (surface mount technology) process, the lead 108 has its outer lead portion 112 exposed at the side edge of the package structure 100 which is bent toward the bottom surface 132 and extended outward to form a gull wing.

The method to improve the heat-dissipating efficiency of the foregoing conventional semiconductor package is to expose the bottom surface 106 of the die pad 102 on the bottom surface of the package structure 100. However, those who is skilled in the art will readily observe that the heat is mainly generated on the active surface 116 and the heat is generally dissipated from the active surface 116 too. The conventional path of heat dissipation from the active surface 116 through the silicon base of the chip 114 and the die pad 102 is rather long. And since the thermal resistance of the silicon base of the chip 114 is rather high, thereby, the heat-dissipating efficiency by transferring the heat from the above-mentioned path of heat-dissipating is rather low. Therefore, the conventional package structure is unable to dissipate the heat effectively, as a result, the performance of the electronic devices will be affected.

SUMMARY OF THE INVENTION

Therefore, it is an objective of the present invention to provide a semiconductor package to improve the heat-dissipating efficiency of the package.

It is another objective of the present invention to provide a semiconductor package that can easily add an external heat dissipator in order to improve the heat-dissipating efficiency of the package further.

It is one other objective of the present invention to provide a semiconductor package having stacked chips in order to improve the heat-dissipating efficiency of the package and to enhance the performance of the electronic devices.

In order to attain the foregoing and other objectives, the present invention provides a semiconductor package having heat sink at the outer surface that is constructed on a lead frame. The package comprises a chip, a die pad, a plurality of leads, a plurality of bonding wires, and a molding compound. The die pad has a first surface and a second surface, and the chip has its active surface bonded to the first surface of the die pad. The area of the die pad is smaller than the area of the chip in order to expose the bonding pads on the active surface of the chip. The leads having an inner lead portions and an outer lead portions are disposed at the periphery of the die pad, and the inner lead portions are electrically connected to the bonding pads by a plurality of bonding wires. The molding compound encapsulates the chip, the die pad, the inner lead portions of the leads, and the bonding wires. The second surface of the die pad is exposed on the top surface of the package structure while the outer lead portion of the leads is exposed at the side edge of the package structure.

According to a preferred embodiment of the present invention, a heat sink and an external heat dissipator can be added to further improve the package's heat-dissipating efficiency. The heat sink is bonded to the back surface of the chip while exposed on the bottom surface of the package structure. And the external heat dissipator is mounted on the exposed surface of the die pad.

Furthermore, in order to attain the foregoing and other objectives, the present invention also provides stacked-chip semiconductor package having heat sink at the outer surface. The stacked-chip semiconductor package comprises a first chip, a second chip, a die pad, a plurality of leads, a plurality of bonding wires, and a molding compound. The first chip has a first active surface and a first back surface wherein the first active surface comprises a plurality of first bonding pads. The second chip has a second active surface and a second back surface wherein the second active surface comprises a plurality of second bonding pads. The first chip has its first back surface bonded to the second back surface of the second chip. The die pad has a first surface and a corresponding second surface wherein the area of the die pad is smaller than the area of the first chip. The die pad has its first surface bonded to the first active surface of the first chip while the first bonding pads on the first active surface of the first chip are exposed. The leads are disposed at the periphery of the die pad, and each of the leads has an inner lead portion and an outer lead portion. The bonding wires electrically connect the first bonding pads to the first surface of the inner lead portion of the leads, and electrically connect the second bonding pads to the second surface of the inner lead portion of the leads. The molding compound encapsulates the first chip, the second chip, the die pad, the inner lead portion of the leads, and the bonding wires to form a package structure. The package structure comprises a first side and a second side wherein the die pad has the second surface exposed on the top surface of the package structure while the outer lead portion of the leads is exposed at the edge of the package structure.

According to another preferred embodiment of the present invention, a heat sink and an external heat dissipator can be added to the stacked chip package to further improve the package's heat-dissipating efficiency. The heat sink is bonded to the active surface of the second chip while exposed on the bottom surface of the package structure. And the external heat dissipator is mounted on the exposed second surface of the die pad.

BRIEF DESCRIPTION OF DRAWINGS

The foregoing and other objectives, characteristics, and advantages of the present invention can be more fully understood by reading the following detailed description of the preferred embodiments, with reference made to the accompanying drawings as follows.

DETAILED DESCRIPTION OF PREFERRED EMBODIMENT

Figure 1:
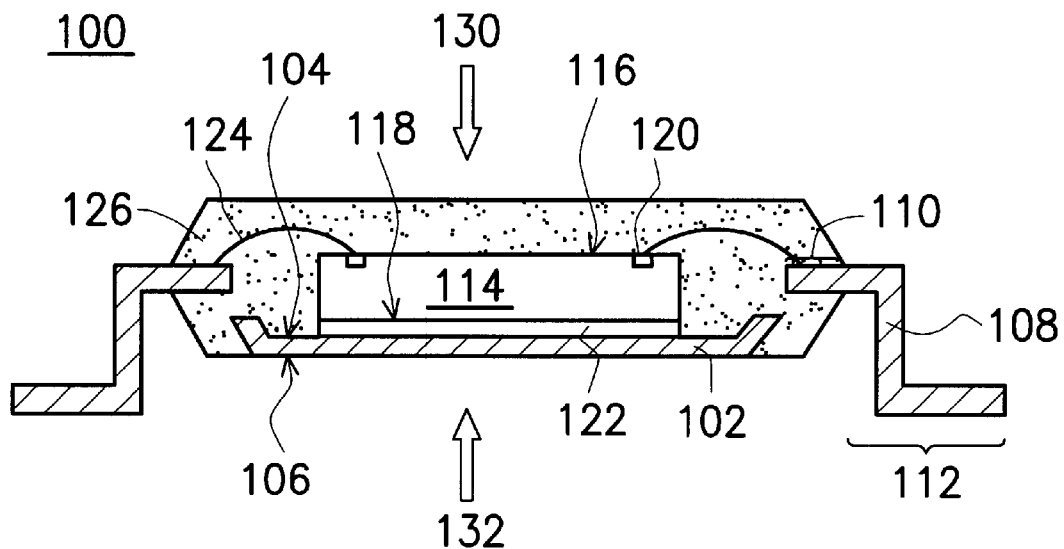
FIG. 1 is a schematic cross-sectional view of a semiconductor package according to a prior art.
Figure 2:
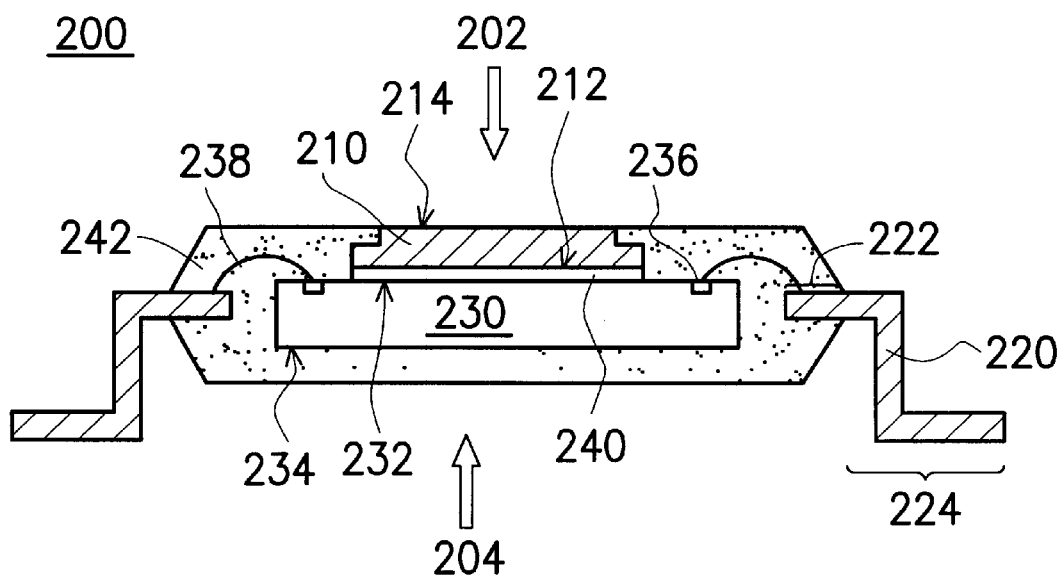
FIG. 2 is a schematic cross-sectional view of a semiconductor package having a heat sink at the outer surface of the first preferred embodiment according to the present invention.
Figure 3:
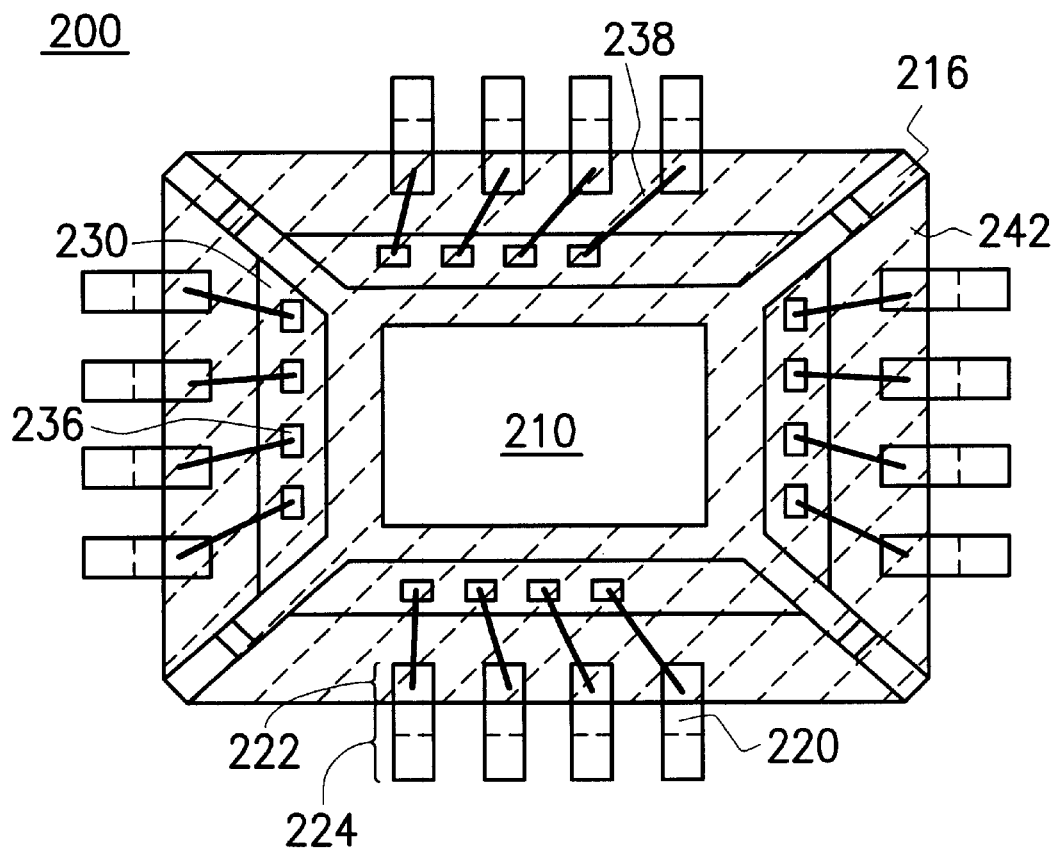
FIG. 3 is a top view of FIG. 2 according to the present invention.

FIG. 2 is a schematic cross-sectional view of a semiconductor package having a heat sink at the outer surface of the first preferred embodiment according to the present invention while FIG. 3 is a top view of FIG. 2 according to the present invention. As shown in FIG. 2, and FIG. 3, a semiconductor package of the first preferred embodiment according to the present invention is constructed on a lead frame that is constituted by a die pad 210 and a plurality of leads 220 disposed on the periphery of the lead frame. The die pad 210 has a first surface 212 (bottom surface) and a second surface 214 (top surface) while the lead 220 has an inner lead portion 222 and an outer lead portion 224. There are tie bars 216 disposed on the periphery of the die pad 210 for connecting the die pad 210 to the guide rail (not shown) of the lead frame. And through the upset of the tie bars 216, the die pad 210 and the leads 220 are on different planes. The die pad 210 is preferably formed a stepped structure on the second surface 214 in order to improve the bondability in the encapsulating process.

The chip 230 has an active surface 232 and a corresponding back surface 234. The devices are mainly formed on the active surface 232, and are electrically connected to the outside connectors through the bonding pads 236 disposed on the active surface 232. The die pad 210 is designed to have its area smaller than the area of the chip 230. And the chip 230 has its active surface 232 bonded to the first surface 212 of the die pad 210 by an adhesive 240 while exposes the bonding pads 236 wherein the adhesive 240 comprises polyimide tape, "thermally conductive and electrically insulative paste" etc. The bonding pads 236 are electrically connected to the inner lead portion 222 of the leads 220 respectively by the bonding wires 238 such as gold wires, aluminum wires etc. A molding compound 242 is employed to encapsulate the chip 230, the die pad 210, and the inner lead portion 222 of the leads 220 to constitute a package structure 200. The package structure 200 has a first side 202 (top surface) and a second side 204 (bottom surface). The outer lead portion 224 of the lead 220 is extended from the side edge of the package structure 200, while the second surface 214 of the die pad 210 is exposed on the first side 202 of the package structure 200. The outer lead portion 224 of the lead 220 is bent toward the second side 204 of the package structure 200 in order to form lead frames of a Pin-Through-Hole (PTH) type, gull wing type, or J type.

As mentioned above, the main source of heat generation is on the active surface 232 of the chip 230, and the die pad 210 is bonded directly to the active surface 232 of the chip 230. Therefore, the heat in the chip 230 can be dissipated directly through the second surface 214 of the die pad 210, that is, through the first side 202 of the package structure 200. This can significantly reduce the heat-dissipating impedance, greatly improve the heat-dissipating efficiency and the performance of the electronic devices. What is more, the space formed by the thickness of the die pad 210 can accommodate sufficient room to contain the bonding wires 238 so as to ascertain that the bonding wires 238 is encapsulated without exposing during the encapsulating process, thereby, the yield will be improved.

Figure 4:
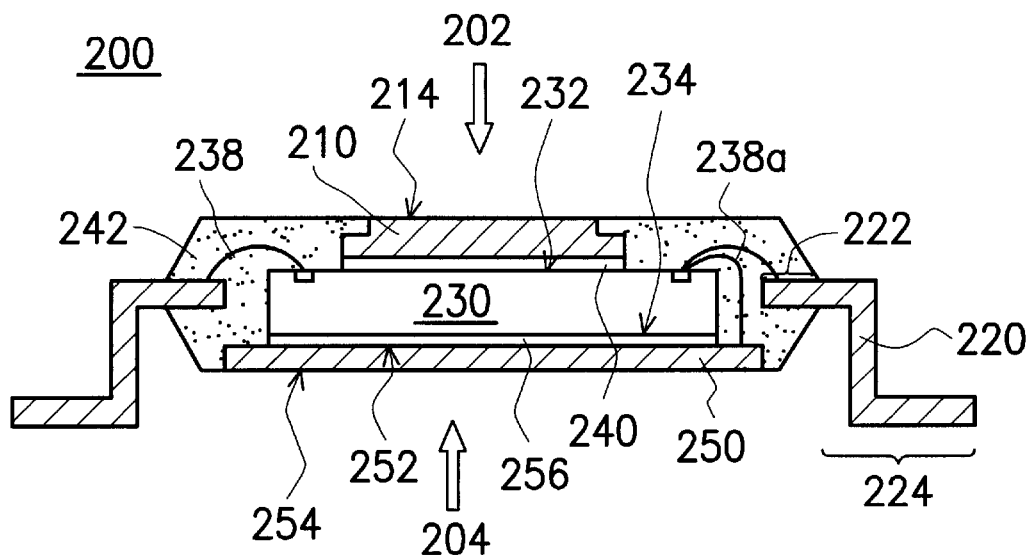
FIG. 4 is a schematic cross-sectional view of a semiconductor package having a heat sink at the outer surface of the second preferred embodiment according to the present invention.

FIG. 4 is a schematic cross-sectional view of a semiconductor package having a heat sink at the outer surface of the second preferred embodiment according to the present invention. As shown in FIG. 4, in order to improve the heat-dissipating efficiency further, an additional heat sink 250 is disposed on the second side 204 of the package structure 200. The heat sink 250 also has a first surface 252 (top surface) and a second surface 254 (bottom surface). The heat sink 250 is having its first surface 252 bonded to the back surface 234 of the chip 230 by an adhesive 256 wherein preferably the adhesive 256 is a heat conductive one. The second surface 254 of the heat sink 250 is exposed on the second side 204 of the package structure 200. Besides, in order to provide a relatively better electrical performance, one can have the heat sink 250 grounded by a ground wire 238a. Therefore, the heat sink 250 can provide the package structure with another heat-dissipating path to further improve the overall heat-dissipating efficiency of the package structure. Besides, the heat sink 250 can even bond to the copper foil (not shown) of a printed circuit board (PCB) in the subsequent manufacturing process to let the heat dissipate through the PCB.

Figure 5:
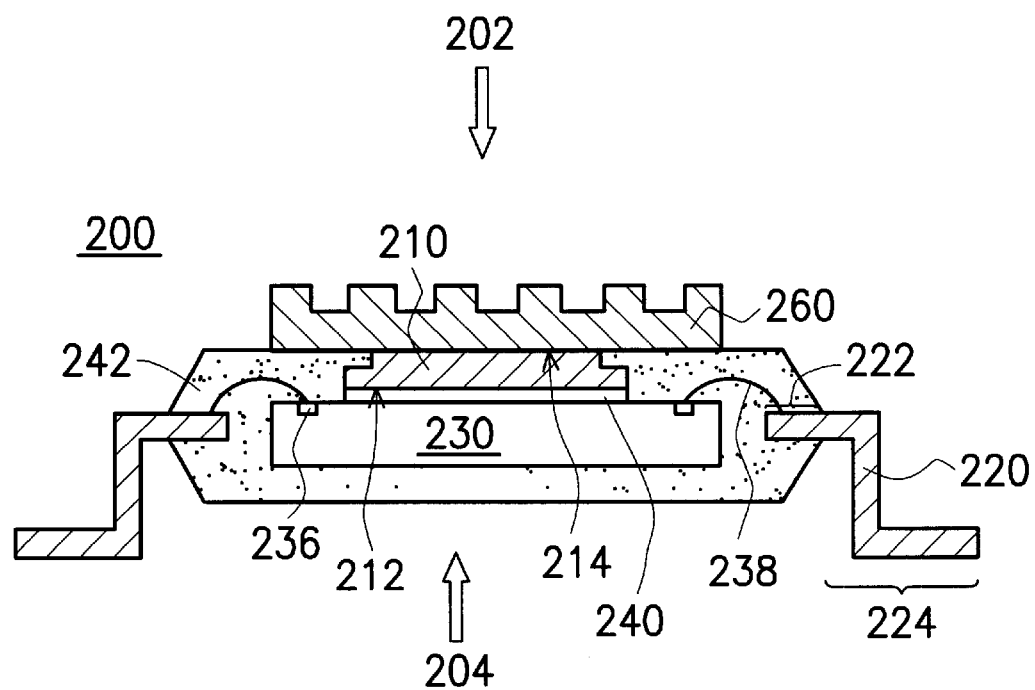
FIG. 5 is a schematic cross-sectional view of a semiconductor package having a heat sink at the outer surface of the third preferred embodiment according to the present invention.

FIG. 5 is a schematic cross-sectional view of a semiconductor package having a heat sink at the outer surface of the third preferred embodiment according to the present invention. As shown in FIG. 5, that the die pad 210 of the present invention exposes its second surface 214 on the first side 202 (top surface) of the package structure 200 facilitates the disposition of an external heat dissipator 260. A preferred external heat dissipator 260 is a heat-dissipating fin that is bonded to the second surface 214 of the die pad 210 so as to further improve the heat-dissipating effect.

Figure 6:
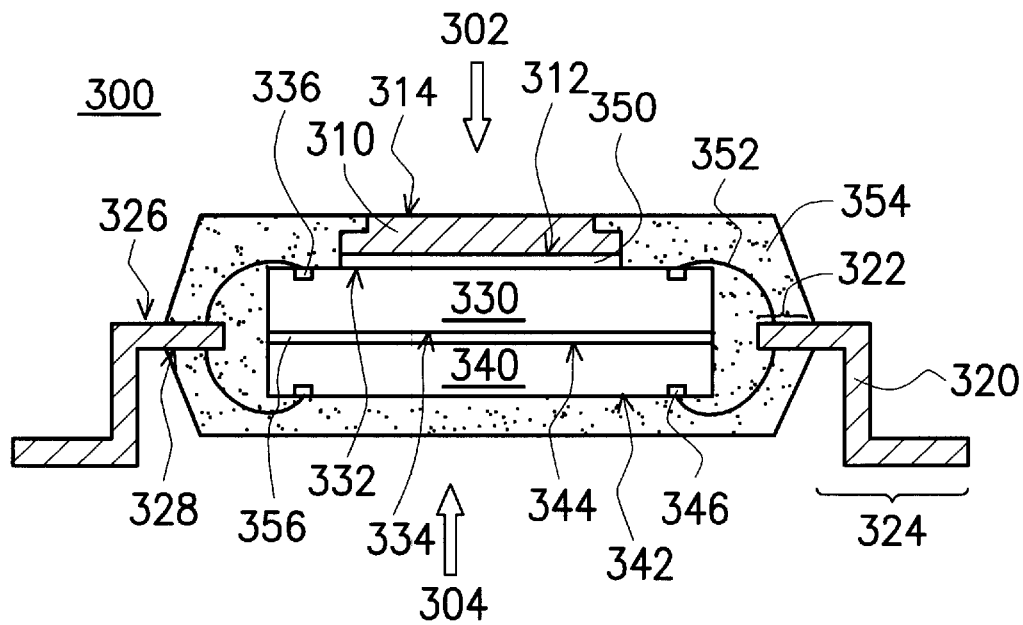
FIG. 6 is a schematic cross-sectional view of a semiconductor package having a heat sink at the outer surface according to the fourth preferred embodiment according to the present invention.

FIG. 6 is a schematic cross-sectional view of a semiconductor package having a heat sink at the outer surface according to the fourth preferred embodiment according to the present invention. As shown in FIG. 6, the package structure of the present invention can also be applied in a stacked-chip package wherein a lead frame is also constituted by a die pad 310 and a plurality of leads 320 disposed around the die pad 310. The die pad 310 has a first surface 312 (bottom surface) and a second surface 314 (top surface). The lead 320 having a first surface 326 and a second surface 328 includes an inner lead portion 322 and an outer lead portion 324. Preferably, the second surface 314 of the die pad 310 forms a stepped structure in order to improve the bondability during the encapsulating process.

The first chip 330 has an active surface 332 and a corresponding back surface 334 wherein devices are mainly formed on the active surface 332 that has a first bonding pads 336 for external connections. Likewise, the second chip 340 has also an active surface 342 and a corresponding back surface 344 wherein devices are mainly formed on the active surface 342 that has a second bonding pads 346 for external connections. The bonding between the first chip 330 and the second chip 340 are back-to-back type with the back surfaces 334, 344 respectively bonded together by an adhesive 356. The area of the die pad 310 is designed to be slightly smaller than the area of the first chip 330. Therefore, when the active surface 332 of the chip 330 is bonded to the first surface 312 of the die pad 310 by an adhesive 350, the active surface 332 can exposes the first bonding pads 336. The preferred adhesives 350 are polyimide, "thermally conductive and electrically insulative paste" etc. The first bonding pads 336 and the second bonding pads 346 are electrically connected to the inner lead portion 322 of the lead 320 by bonding wires 352 respectively. The preferred bonding wires 352 are gold wires, aluminum wires etc. Among them, the bonding wires 352, which are connected to the first bonding pads 336, are bonded to the first surface 326 of the inner lead portion 322 of the lead 320. Likewise, the bonding wires 352, which are connected to the second bonding pads 346, are bonded to the second surface 328 of the inner lead portion 322 of the lead 320. In this way, a package structure 300 having a first side 302 (top surface) and a second side 304 (bottom surface) is accomplished. The lead 320 is formed with its outer lead portion 324 extended outward from the inner lead portion 322 from the edge of the package structure 300, then downward to the second side 304 of the package structure 300. The preferred kinds of lead are the PTH (Pin-Through-Hole) type, gull-wing type, or J-type etc.

As mentioned above, the main source of heat generation of a chip is on its active surface. Since the die pad 310 is bonded directly to the active surface 332 of the chip 330, and since the die pad 310 also has its second surface 314 exposed on the first side 302 of the package structure 300, the heat generated in the chip 330 can be dissipated through the die pad 310. This enables the devices in the package structure 300 to reduce the thermal resistance significantly and improve the heat-dissipating efficiency to a great extent. Moreover, the space formed by the thickness of the die pad 310 can accommodate sufficient room for containing the bonding wires 352, thereby, the package structure 300 can ascertain to contain the bonding wires 352 without exposure while encapsulating, thereby, the yield can be improved.

Figure 7:
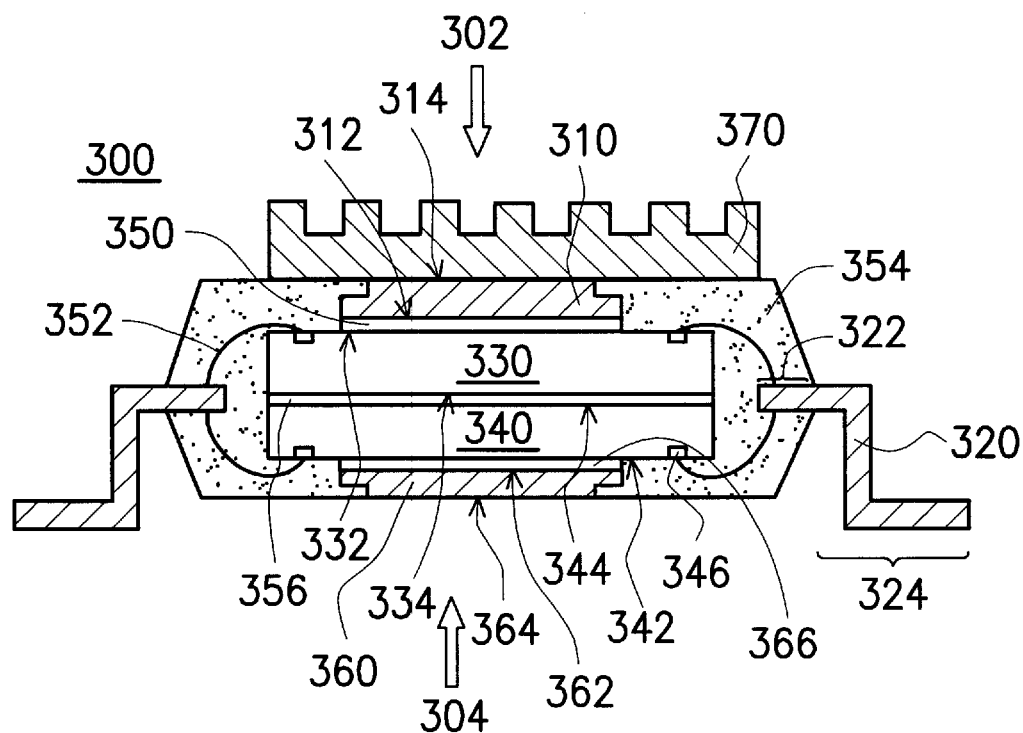
FIG. 7 is a schematic cross-sectional view of a semiconductor package having a heat sink at the outer surface of the fifth preferred embodiment according to the present invention.

FIG. 7 is a schematic cross-sectional view of a semiconductor package having a heat sink at the outer surface of the fifth preferred embodiment according to the present invention. As shown in FIG. 7, in order to improve the heat-dissipating efficiency further, a heat sink 360 is added on the second side 304 of the package structure 300. The heat sink 360 has also a first surface 362 (top surface) and a second surface 364 (bottom surface) wherein the surface area of the heat sink 360 is designed to be smaller than the surface area of the second chip 340. For this reason, when the heat sink 360 has its first surface 362 bonded to the active surface 342 of the second chip 340 by an adhesive 366, the second bonding pads 346 on the active surface 342 of the second chip 340 can be exposed for external connections. The preferred adhesive 366 are polyimide, "thermally conductive and electrically insulative paste" etc. The heat sink 360 has its second surface 364 exposed on the second side 304 of the package structure 300. Moreover, another heat sink 370, such as heat-dissipating fin, bonded to the second surface 314 of the die pad 310 can also be added on the first side 302 of the package structure 300. In this way, the heat sinks 360 and 370 can provides the package structure 300 with some other paths of heat dissipation that can further improve the heat-dissipating efficiency. Besides, the heat sink 360 can even be bonded to the copper foil (not shown) on the printed circuit board (PCB) in the subsequent process to let the heat dissipate through the PCB.

To summarize the foregoing illustration disclosed by preferred embodiments of the present invention, the semiconductor package having heat sink at the outer surface of the present invention comprise the following advantages:

1. Either the single-chip or stacked-chip semiconductor package having heat sink at the outer surface of the present invention can reduce the thermal resistance and improve the heat-dissipating efficiency. This is because that the die pad having one of its surfaces exposed has its another surface directly bonded to the active surface of the chip.
2. Either the single-chip or stacked-chip semiconductor package having heat sink at the outer surface of the present invention can further improve the heat-dissipating efficiency since the die pad is exposed on the top side of the package structure that facilitates the adding of an extra heat sink.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A stacked-chip semiconductor package having an external heat sink at the outer surface thereof comprising:

a first chip, having a first active surface and an opposite first back surface wherein the first active surface comprises a plurality of first bonding pads located at a periphery thereof;

a second chip, having a second active surface and an opposite second back surface wherein the second active surface comprises a plurality of second bonding pads located at the periphery thereof; and being bonded by its second back surface to the first back surface of the first chip;

a die pad, having a first surface and an external exposing opposite second surface wherein the area of the external opposite second surface is smaller than the area of the first surface and the area of the first surface of the die pad is smaller than the area of the first chip, and the die pad has its first surface bonded to a central portion of the first active surface of the first chip;

a plurality of leads, each of which having an inner lead portion that approaches proximate to the periphery of the die pad, and an outer lead portion;

a plurality of bonding wires, which electrically connect the first bonding pads to the first surface of the inner lead portion of the lead and electrically connect the second bonding pads to the second surface of the inner lead portion of the leads;

a heat sink having a first surface and an opposite exposing second surface, wherein an area of the heat sink is smaller than an area of the second chip, wherein the heat sink has its first surface bonded to the second active surface of the second chip and the opposite exposing second surface being connected to the copper foil on a printer circuit board for improved heat dissipation by conduction;

an external heat dissipator having fins for allowing improved heat dissipation by convection disposed on the second surface of the die pad; and a molding compound, encapsulating the first chip, the second chip, the die pad, the inner lead portion of the leads, the heat sink and the bonding wires to form a package structure, and the package structure comprises a first side and a second side wherein the die pad has the second surface exposed on the first side of the package structure, while the outer lead portion of the lead extends out of the edge of the package structure, wherein the second surface of the heat sink on the second side of the package structure is exposed.

2. The stacked-chip semiconductor package having heat sink at the outer surface of claim 1 wherein the outer lead portion of the lead is extended downward to the second side by bending.

3. The stacked-chip semiconductor package having heat sink at the outer surface of claim 1 wherein the first chip has its first active surface bonded to the first surface of the die pad by a polyimide tape.

4. The stacked-chip semiconductor package having heat sink at the outer surface of claim 1 wherein the chip has its first active surface bonded to the first surface of the die pad by a "thermally conductive and electrically insulative paste".

5. The stacked-chip semiconductor package having heat sink at the outer surface of claim 1 further comprising a plurality of tie bars connected to the die pad and encapsulated in the molding compound.

6. The stacked-chip semiconductor package having heat sink at the outer surface of claim 1 wherein the second chip has its second active surface bonded to the first surface of the heat sink by a polyimide tape.

7. The stacked-chip semiconductor package having heat sink at the outer surface of claim 1 wherein the second chip has its second active surface bonded to the first surface of the heat sink by a "thermally conductive and electrically insulative paste".

* * * * *